US012628338B2

(12) United States Patent
Kim et al.

(10) Patent No.: US 12,628,338 B2
(45) Date of Patent: May 12, 2026

(54) SEMICONDUCTOR DEVICE

(71) Applicant: Samsung Electronics Co., Ltd., Suwon-si (KR)

(72) Inventors: Eunjung Kim, Suwon-si (KR); Jaehyung Park, Suwon-si (KR); Kihyung Nam, Suwon-si (KR); Hoju Song, Suwon-si (KR); Yunjae Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 359 days.

(21) Appl. No.: 18/344,077

(22) Filed: Jun. 29, 2023

(65) Prior Publication Data

US 2024/0032287 A1     Jan. 25, 2024

(30) Foreign Application Priority Data

Jul. 20, 2022     (KR) ........................ 10-2022-0089883

(51) Int. Cl.
*H10B 12/00*          (2023.01)
(52) U.S. Cl.
CPC ............. *H10B 12/50* (2023.02); *H10B 12/09* (2023.02); *H10B 12/482* (2023.02); *H10B 12/488* (2023.02)
(58) Field of Classification Search
CPC .............. G11C 16/08; G11C 7/18; G11C 8/10
See application file for complete search history.

(56) References Cited

U.S. PATENT DOCUMENTS 8,623,727 B2 *   1/2014   Shin ...................... H01L 23/485
                                                257/E21.585
8,735,977 B2 *   5/2014   Lee ........................ H10D 89/10
                                                257/330
(Continued)

FOREIGN PATENT DOCUMENTS

KR      10-2013-0037880 A      4/2013
KR      10-2016-0068067 A      6/2016
(Continued)

OTHER PUBLICATIONS

Extended European Search Report dated Jan. 4, 2024 issued in European Patent Application No. 23184946.4-1212.
(Continued)

*Primary Examiner* — Edward Chin
(74) *Attorney, Agent, or Firm* — HARNESS, DICKEY & PIERCE, P.L.C.

(57)          ABSTRACT

A semiconductor device including a substrate including a cell array region and a peripheral circuit region, the substrate including first active region defined in the cell array region and second active region defined in the peripheral circuit region, a plurality of word lines in the substrate and extending in a first direction, a bit line in the cell array region and extending in a second direction perpendicular to the first direction, a plurality of first pad separation patterns on corresponding once of the word lines, respectively, and extending in the first direction, a cell pad structure on the substrate and between two adjacent ones of the first pad separation patterns, and a second pad separation pattern between two adjacent ones of the first pad separation patterns and being adjacent to the cell pad structure may be provided.

20 Claims, 16 Drawing Sheets

(56)                    References Cited

U.S. PATENT DOCUMENTS

| | | | | |
|---|---|---|---|---|
| 8,975,140 | B2 * | 3/2015 | Chung | H01L 21/76224 |
| | | | | 438/270 |
| 9,087,728 | B2 * | 7/2015 | Chung | H10B 12/488 |
| 9,330,978 | B2 * | 5/2016 | Taniguchi | H10D 84/0135 |
| 9,373,625 | B2 * | 6/2016 | Kim | H10B 12/34 |
| 10,141,316 | B2 * | 11/2018 | Lee | H10B 12/34 |
| 10,163,909 | B2 * | 12/2018 | Wang | H01L 23/5226 |
| 10,573,652 | B2 | 2/2020 | Lee et al. | |
| 10,923,390 | B2 | 2/2021 | Yoon | |
| 2017/0084710 | A1 * | 3/2017 | Koh | H10B 12/053 |
| 2017/0110507 | A1 * | 4/2017 | Suh | H10D 1/00 |
| 2019/0096890 | A1 * | 3/2019 | Lee | H10B 12/485 |
| 2019/0157282 | A1 * | 5/2019 | Jung | G11C 16/08 |
| 2022/0005811 | A1 | 1/2022 | Kim et al. | |

FOREIGN PATENT DOCUMENTS

| | | | |
|---|---|---|---|
| KR | 10-2017-0103204 | A | 9/2017 |
| KR | 10-2018-0069186 | A | 6/2018 |
| KR | 10-2019-0035250 | A | 4/2019 |
| KR | 10-2022-0083386 | A | 12/2020 |
| TW | 202220143 | A | 5/2022 |

OTHER PUBLICATIONS

Taiwan Office Action dated Jan. 22, 2026 issued in TW Patent Application No. 112126579.
Korean Office Action dated Feb. 2, 2026 issued in KR Patent Application No. 10-2022-0089883.

* cited by examiner

SEMICONDUCTOR DEVICE

CROSS-REFERENCE TO RELATED APPLICATION

This application is based on and claims priority under 35 U.S.C. § 119 to Korean Patent Application No. 10-2022-0089883, filed on Jul. 20, 2022, in the Korean Intellectual Property Office, the disclosure of which is incorporated by reference herein in its entirety.

BACKGROUND

The inventive concepts relate to semiconductor devices. More particularly, the inventive concepts relate to semiconductor devices including a cell pad structure.

With the development of the electronics industry, semiconductor devices are gradually being downscaled. Accordingly, the size of individual microcircuit patterns for implementing a semiconductor device is further reduced. In addition, as the integrated circuit device is highly integrated, the line width of the bit line decreases and the difficulty of the process for forming the contact between the bit lines increases.

SUMMARY

The inventive concepts provide semiconductor devices capable of reducing the cost of a semiconductor device manufacturing process while improving reliability.

According to an aspect of the inventive concepts, a semiconductor device including a substrate includes a cell array region and a peripheral circuit region, the substrate including a plurality of first active regions defined in the cell array region and at least one second active region defined in the peripheral circuit region, a plurality of word lines in the substrate and extending in a first direction, a plurality of bit lines in the cell array region of the substrate and extending in a second direction perpendicular to the first direction, a plurality of first pad separation patterns on corresponding ones of the word lines, respectively, the first pad separation patterns extending in the first direction, a cell pad structure on the substrate and being between two adjacent ones of the first pad separation patterns, and a second pad separation pattern between two adjacent ones of the first pad separation patterns and being adjacent to the cell pad structure, wherein a cross-section of the cell pad structure perpendicular to the first direction has a quadrangular shape in which both corners of a lower surface are rounded.

According to another aspect of the inventive concepts, a semiconductor device including a substrate includes a cell array region, a boundary region, and a peripheral circuit region, the substrate including a plurality of first active regions defined in the cell array region and at least one second active region defined in the peripheral circuit region, a word line in the substrate and extending in a first direction, a bit line in the cell array region of the substrate and extending in a second direction perpendicular to the first direction, a plurality of first pad separation patterns on the word line, the first pad separation patterns extending in the first direction, a cell pad structure on the substrate and between two adjacent ones of the first pad separation patterns, a second pad separation pattern between two adjacent ones of the first pad separation patterns the second pad separation pattern being adjacent to the cell pad structure, a first insulating layer on the cell pad structure and extending to the boundary region, and a second insulating layer on the first insulating layer and extending to the boundary region, wherein a first cross-section of the cell pad structure perpendicular to the first direction has a quadrangular shape, in which both corners of a lower surface are rounded, and wherein an upper surface of the first insulating layer and an upper surface of the second insulating layer are flat.

According to another aspect of the inventive concepts, a semiconductor device includes a substrate including a cell array region, a boundary region, and a peripheral circuit region, the substrate including a plurality of first active regions defined in the cell array region and at least one second active region defined in the peripheral circuit region, a word line in the substrate and extending in a first direction, a capping insulating film on the word line, a bit line in the cell array region of the substrate and extending in a second direction perpendicular to the first direction, a direct contact between the bit line and a corresponding one of the first active regions, a plurality of cell pad structures in contact with the first active regions, respectively, the cell pad structures being on the substrate, a buried contact on a corresponding one of the cell pad structures, a first pad separation pattern on the word line and extending in the first direction, a second pad separation pattern between two adjacent ones of the cell pad structures and extending in the second direction, a buffer layer on the cell pad structure and extending to the boundary region, and a first insulating layer on the buffer layer and extending to the boundary region, wherein a first cross-section of each of the cell pad structures perpendicular to the first direction has a quadrangular shape, in which both corners of a lower surface are rounded, wherein an upper surface of the buffer layer and an upper surface of the first insulating layer are flat, and wherein the capping insulating film and a corresponding one of the first pad separation patterns are portions of a single integral structure, respectively.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
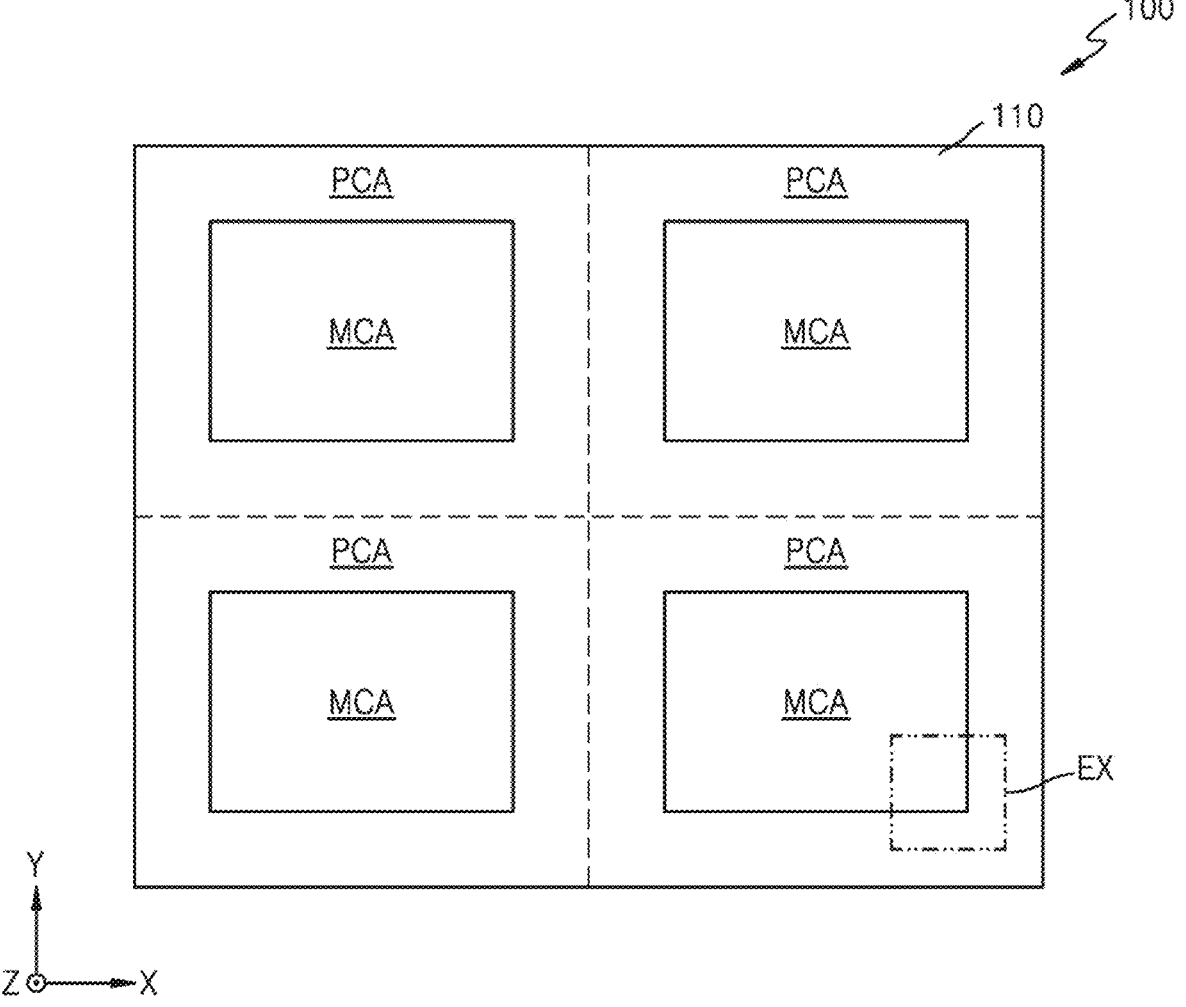
FIG. 1 is a layout diagram illustrating a semiconductor device according to an example embodiment of the inventive concepts.

Hereinafter, some example embodiments of the technical ideas of the inventive concepts will be described in detail with reference to the accompanying drawings. The same reference numerals are used for the same components in the drawings, and duplicate descriptions thereof are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
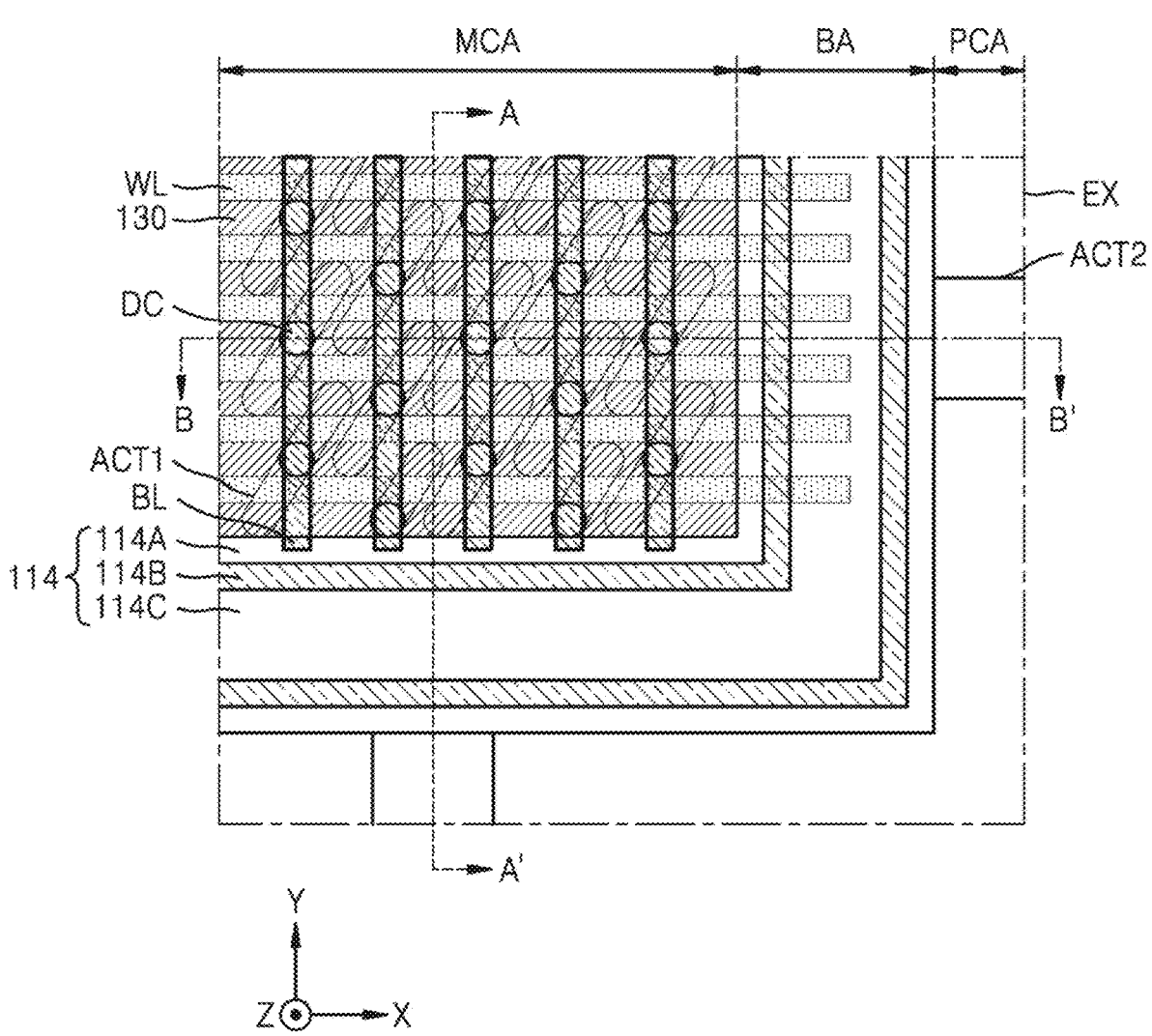
FIG. 2 is an enlarged layout diagram of a portion EX of FIG. 1.
Figure 3A:
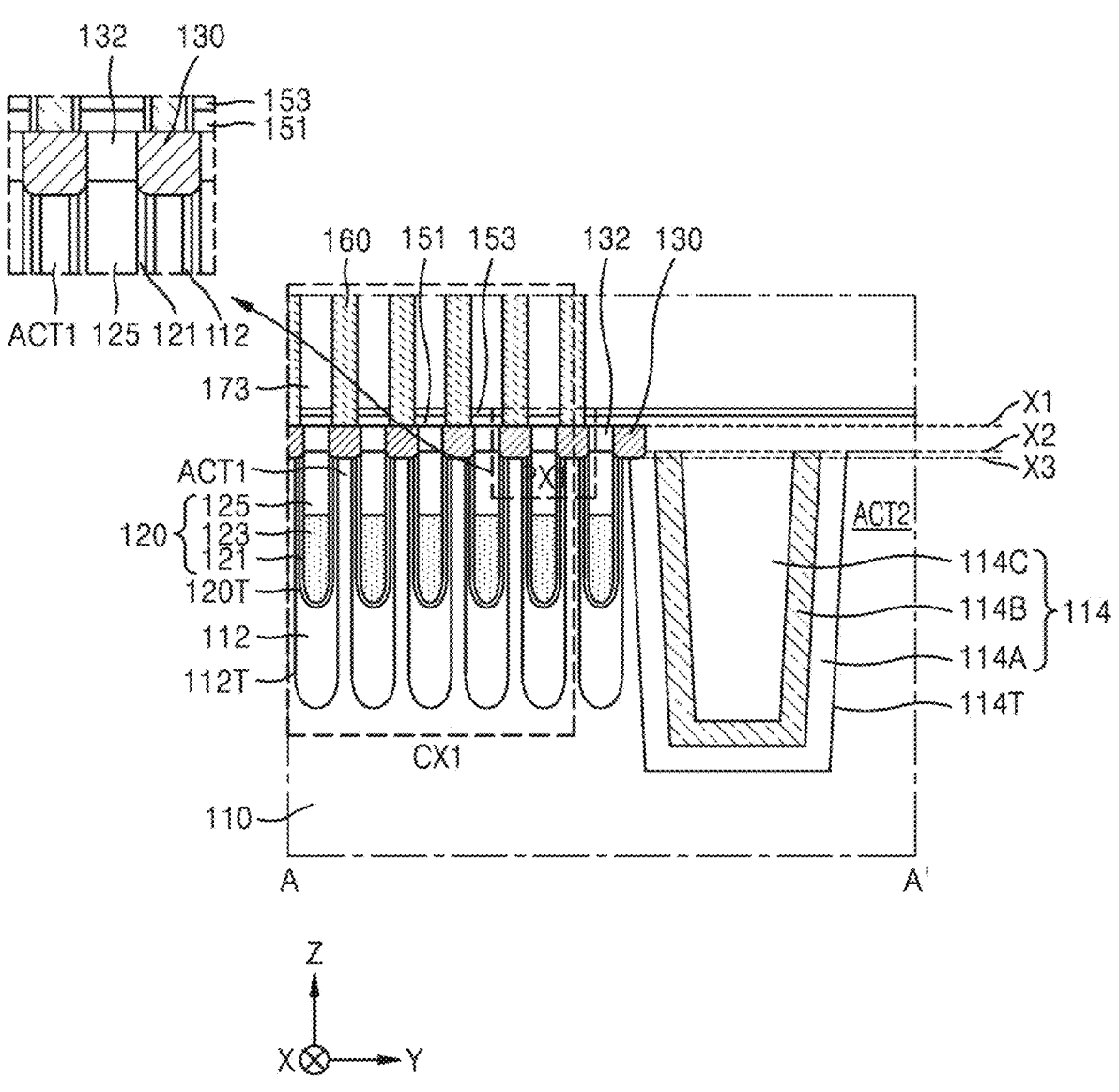
FIG. 3A is a cross-sectional view taken along line A-A' of FIG. 2.
Figure 3B:
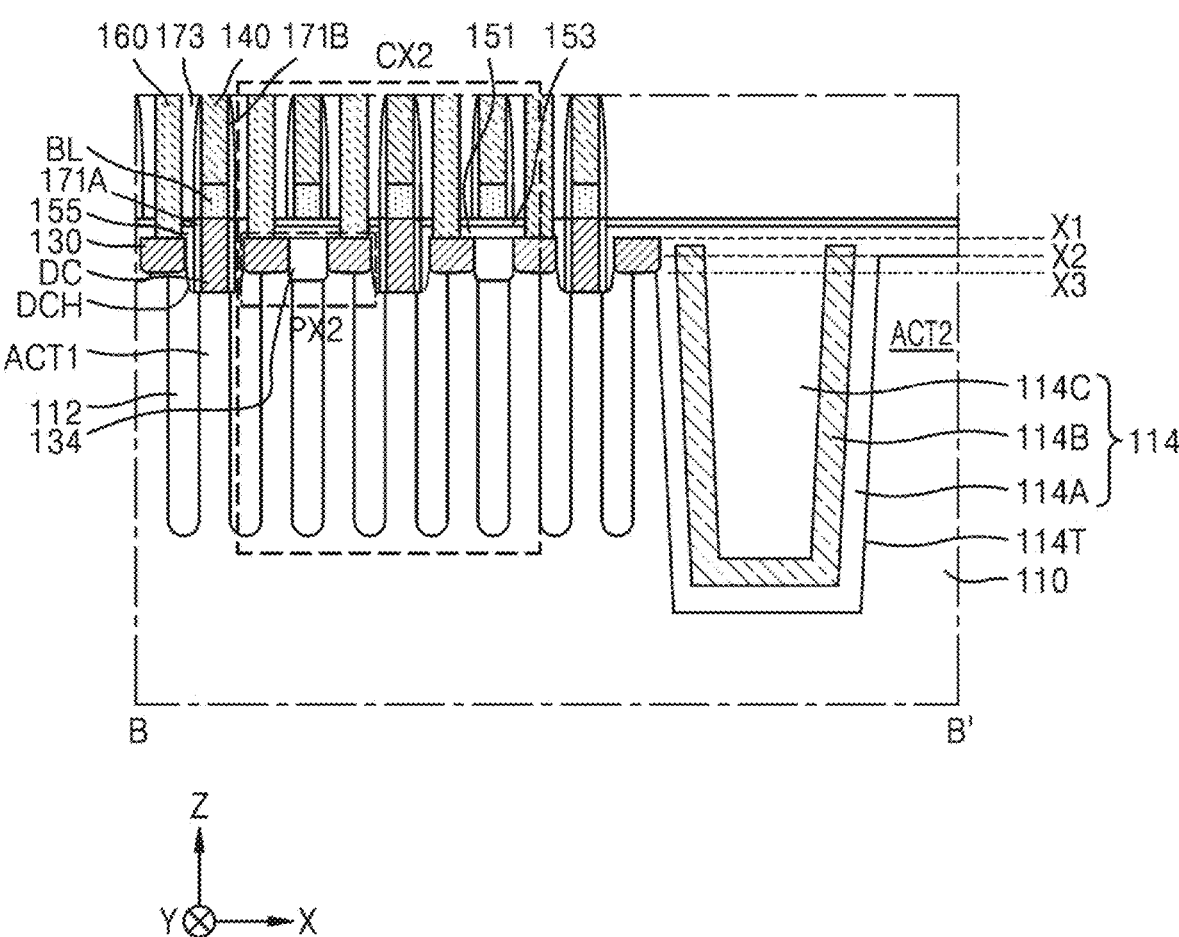
FIG. 3B is a cross-sectional view taken along line B-B' of FIG. 2.

FIG. 1 is a layout diagram illustrating a semiconductor device 100 according to an example embodiment of the inventive concepts. FIG. 2 is an enlarged layout diagram of a portion EX of FIG. 1. FIG. 3A is a cross-sectional view taken along line A-A' of FIG. 2. FIG. 3B is a cross-sectional view taken along line B-B' of FIG. 2.

Referring to FIGS. 1 to 3B, the semiconductor device 100 may include a substrate 110 including a cell array region MCA and a peripheral circuit region PCA. The cell array region MCA may be a memory cell region of a dynamic random access memory (DRAM) element, and the peripheral circuit region PCA may be a core region or a peripheral circuit region of the DRAM element. For example, the cell array region MCA may include a cell transistor CTR and a capacitor structure (not shown) connected thereto, and the peripheral circuit region PCA may include a peripheral circuit transistor (not shown) for transmitting a signal and/or power to a cell transistor (not shown) included in the cell array region MCA. In some example embodiments, the peripheral circuit transistor may configure various circuits such as a command decoder, a control logic, an address buffer, a row decoder, a column decoder, a sense amplifier, and a data input/output circuit.

A boundary trench 114T may be formed in a boundary region BA between the cell array region MCA and the peripheral circuit region PCA, and a boundary structure 114 may be formed in the boundary trench 114T. In a plan view, the boundary trench 114T may be disposed to surround four surfaces (e.g., four sides) of the cell array region MCA. The boundary structure 114 may include a buried insulating layer 114A, an insulating liner 114B, and a gap-fill insulating layer 114C disposed inside the boundary trench 114T.

The buried insulating layer 114A may be conformally disposed on the inner wall of the boundary trench 114T. In some example embodiments, the buried insulating layer 114A may include silicon oxide. For example, the buried insulating layer 114A may include silicon oxide formed by an atomic layer deposition (ALD) process, a chemical vapor deposition (CVD) process, a plasma enhanced CVD (PECVD) process, a low pressure CVD (LPCVD) process, or the like.

The insulating liner 114B may be conformally disposed on the inner wall of the boundary trench 114T, more specifically, on the buried insulating layer 114A. In some example embodiments, the insulating liner 114B may include silicon nitride. For example, the insulating liner 114B may include silicon nitride formed by an ALD process, a CVD process, a PECVD process, an LPCVD process, or the like.

The gap-fill insulating layer 114C on the insulating liner 114B may fill the inside of the boundary trench 114T. In some example embodiments, the gap-fill insulating layer 114C may include silicon oxide, such as tonen silazene (TOSZ), undoped silicate glass (USG), boro-phospho-silicate glass (BPSG), phosphosilicate glass (PSG), flowable oxide (FOX), plasma enhanced deposition of tetra-ethyl-ortho-silicate (PE-TEOS), or fluoride silicate glass (FSG).

A plurality of first active regions ACT1 may be disposed to have long axes in a diagonal direction with respect to a first horizontal direction X and a second horizontal direction Y, respectively. A plurality of word lines WL may extend parallel to each other in the first horizontal direction X across the plurality of first active regions ACT1. A plurality of bit lines BL may extend parallel to each other in the second horizontal direction Y on the plurality of word lines WL. The plurality of bit lines BL may be connected to the plurality of first active regions ACT1 through direct contacts DC, respectively.

A plurality of cell pad structures 130 may be formed between two adjacent bit lines BL among the plurality of bit lines BL. The plurality of cell pad structures 130 may be arranged in a line in the first horizontal direction X and the second horizontal direction Y.

The substrate 110 may include silicon, for example, single crystal silicon, polycrystalline silicon, or amorphous silicon. In some other example embodiments, the substrate 110 may include at least one selected from Ge, SiGe, SiC, GaAs, InAs, and InP. In some example embodiments, the substrate 110 may include a conductive region, for example, a well doped with an impurity, or a structure doped with an impurity.

An element isolation trench 112T may be formed in the substrate 110, and an element isolation film 112 may be formed in the element isolation trench 112T. The element isolation film 112 may include, for example, an oxide film, a nitride film, or a combination thereof. In the cell array region MCA, a plurality of first active regions ACT1 may be defined on the substrate 110 by the element isolation film 112, and at least one second active region ACT2 may be defined on the substrate 110 in the peripheral circuit region PCA.

In the cell array region MCA, a plurality of word line trenches 120T, which extends in a first horizontal direction (X direction) to intersect with a plurality of first active regions ACT1, may be disposed in the substrate 110, and a buried gate structure 120 may be disposed in each of the plurality of word line trenches 120T. The buried gate structure 120 may include a gate dielectric film 121, a gate electrode 123, and a capping insulating film 125. The plurality of gate electrodes 123 may correspond to the plurality of word lines WL illustrated in FIG. 1, respectively.

The gate dielectric film 121 may include a silicon oxide film, a silicon nitride film, a silicon oxynitride film, an oxide/nitride/oxide (ONO) film, or a high-k dielectric film having a higher dielectric constant than that of the silicon oxide film. The gate electrode 123 may include Ti, TiN, Ta, TaN, W, WN, TiSiN, WSiN, or a combination thereof. The capping insulating films 125 may include a silicon oxide film, a silicon nitride film, a silicon oxynitride film, or a combination thereof.

A plurality of first pad separation patterns 132 may be disposed on the plurality of buried gate structures 120, respectively. Each of the plurality of first pad separation patterns 132 may extend in the first direction (X direction) and may be apart from each other in a second direction (Y direction). The first pad separation pattern 132 may include, for example, silicon nitride. In some example embodiments, the first pad separation pattern 132 may be integrally formed with the capping insulating film 125. In other words, the capping insulating film 125 and the first pad separation pattern 132 may be portions of a single integral structure, respectively. Accordingly, the length of the first pad separation pattern 132 in the second direction (Y direction) may be the same as the length of the capping insulating film 125 in the second direction (Y direction). However, the inventive concepts are not limited thereto, and if desired, spacers (not shown) may be additionally formed on both sidewalls of the first pad separation pattern 132.

The plurality of cell pad structures 130 may be disposed between two adjacent first pad separation patterns 132. In some example embodiments, a cross-section of the cell pad structure 130 perpendicular to the first direction (X direction) may have a quadrangular shape in which both corners of the lower surface are rounded. As stated later, after forming the first separation pad pattern 132 by using a first mask pattern Ox (refer to FIG. 6A) used to form the word line WL, without using a separate mask pattern, and the cell pad structure 130 is formed using the first separation pad pattern 132, the aforementioned cross-sectional shape of the cell pad structure 130 may be obtained. Because a separate mask pattern is not used to form the first pad separation pattern 132, compared to the case of forming pad separation patterns using two mask patterns in the conventional art, the manufacturing process of the semiconductor device 100 may be simplified. Accordingly, the cost of the manufacturing process of the semiconductor device 100 may be reduced.

In some example embodiments, as shown in FIGS. 3A and 3B, the upper surface of the cell pad structure 130 may be disposed at a higher vertical level than the upper surface of the second active region ACT2, and the lower surface of the cell pad structure 130 may be disposed at a lower vertical level than the upper surface of the second active region ACT2. For example, the upper surface of the cell pad structure 130 may be disposed at the first vertical level X1, the upper surface of the second active region ACT2 may be disposed at a second vertical level X2 that is lower than the first vertical level X1, and the lower surface of the cell pad structure 130 may be disposed at a third vertical level X3 that is lower than the second vertical level X2. As shown in FIGS. 3A and 3B, the cell pad structure 130 is disposed on the first active region ACT1. Accordingly, the lower surface of the cell pad structure 130 and the upper surface of the first active region ACT1 may be disposed at the same vertical level. Because the lower surface of the cell pad structure 130 is located at a lower vertical level than the upper surface of the second active region ACT2, the upper surface of the first active region ACT1 may also be located at a lower vertical level than the lower surface of the second active region ACT2. This is because, as will be described later with reference to FIGS. 6C and 6D, a process of recessing the upper surface of the first active region ACT1 of the substrate 110 is performed in the manufacturing process of the semiconductor device 100. When such a recess process is performed, even if the cell pad structure 130 is disposed on the upper surface of the first active region ACT1, a step difference between the cell array region MCA and the peripheral circuit region PCA due to the length of the cell pad structure 130 in the third direction (Z direction) may be minimized. In addition, compared to the case where the recess process is not performed, the desired length in the third direction (Z direction) of the first mask pattern Ox used to form the first pad separation pattern 132 may be reduced, thereby reducing the difficulty of the manufacturing process of the semiconductor device 100.

In some example embodiments, the lower surfaces of the plurality of cell pad structures 130 may be disposed at a lower vertical level than the lower surfaces of the first pad separation pattern 132, and the upper surfaces of the plurality of cell pad structures 130 may be disposed at the same vertical level as the upper surface of the first pad separation pattern 132.

In some example embodiments, the lower surfaces of the plurality of cell pad structures 130 may be disposed at a higher vertical level than the lower surfaces of a second pad separation pattern 134, and the upper surfaces of the plurality of cell pad structures 130 may be disposed at the same vertical level as the upper surface of the second pad separation pattern 134.

In some example embodiments, the plurality of cell pad structures 130 may include Si, Ge, W, WN, Co, Ni, Al, Mo, Ru, Ti, TiN, Ta, TaN, Cu, or a combination thereof.

The plurality of second pad separation patterns 134 may be disposed between two adjacent first pad separation patterns 132. The plurality of second pad separation patterns 134 may be disposed adjacent to the cell pad structure 130. The plurality of second pad separation patterns 134 may extend in the second direction. The plurality of second pad separation patterns 134 may have an island-like pattern shape in a plan view. The second pad separation pattern 134 may include, for example, silicon nitride.

A first insulating layer 151 and a second insulating layer 153 may be sequentially disposed on the cell pad structure 130, the first pad separation pattern 132, and the second pad separation pattern 134. In some example embodiments, the first insulating layer 151 and the second insulating layer 153 extend in parallel in the first direction (X direction) and the second direction (Y direction) from the cell array region MCA on the substrate 110 to the boundary region BA and may be flat. The first insulating layer 151 may be, for example, silicon oxide, and the second insulating layer 153 may be, for example, silicon nitride.

A plurality of buried contacts 160 may be disposed on the plurality of cell pad structures 130. The plurality of buried contacts 160 may pass through the first insulating layer 151 and the second insulating layer 153. The plurality of buried contacts 160 may be disposed to partially overlap in the third direction (Z direction) corresponding ones of the plurality of cell pad structures 130, respectively. The plurality of cell pad structures 130 and the plurality of buried contacts 160 may connect a capacitor structure (not shown) formed on the plurality of bit lines BL to the first active region ACT1.

The plurality of buried contacts 160 may be electrically insulated from each other by the second insulating pattern 173 surrounding the plurality of buried contacts 160. The second insulating pattern 173 may include at least one of silicon nitride, silicon oxide, and silicon oxynitride.

A capacitor structure (not shown) may be disposed on the plurality of buried contacts 160.

A plurality of direct contacts DC may be formed in the plurality of direct contact holes DCH on the substrate 110. The plurality of direct contacts DC may pass through the first insulating layer 151 and the second insulating layer 153. The plurality of direct contacts DC may be connected to the plurality of first active regions ACT1. The plurality of direct contacts DC may include TiN, TiSiN, W, tungsten silicide, doped polysilicon, or a combination thereof.

The direct contact spacers 171A may be disposed on both sidewalls of the plurality of direct contacts DC. The direct contact spacer 171A may cover both sidewalls of the direct contact DC.

The first insulating pattern 155 is formed on an inner wall of the direct contact hole DCH and may fill the direct contact hole DCH. The upper surface of the first insulating pattern 155 may be disposed at the same vertical level as the upper surface of the direct contact DC.

A plurality of bit lines BL may extend in the second horizontal direction Y on the substrate 110 and the plurality of direct contacts DC. Each of the plurality of bit lines BL may be connected to the first active region ACT1 through a direct contact DC. The plurality of bit lines BL may include ruthenium (Ru), tungsten (W), cobalt (Co), titanium (Ti), titanium nitride (TiN), or a combination thereof.

The plurality of bit lines BL may be covered with a plurality of insulating capping structures 140, respectively. The plurality of insulating capping structures 140 may extend in the second horizontal direction Y on the plurality of bit lines BL.

A bit line spacer 171B may be disposed on both sidewalls of each of the plurality of bit lines BL. The bit line spacers 171B may extend in the second direction (Y direction) on both sidewalls of the plurality of bit lines BL. The bit line spacer 171B may extend in the third direction (Z direction) on both sidewalls of the plurality of bit lines BL to cover both sidewalls of the insulating capping structure 140. Although the bit line spacer 171B is shown as a single material layer in FIG. 3B, in some example embodiments, the bit line spacer 175 may be formed in a stacked structure of a plurality of spacer layers (not shown), and at least one of the plurality of spacer layers may be an air spacer.

Figure 4A:
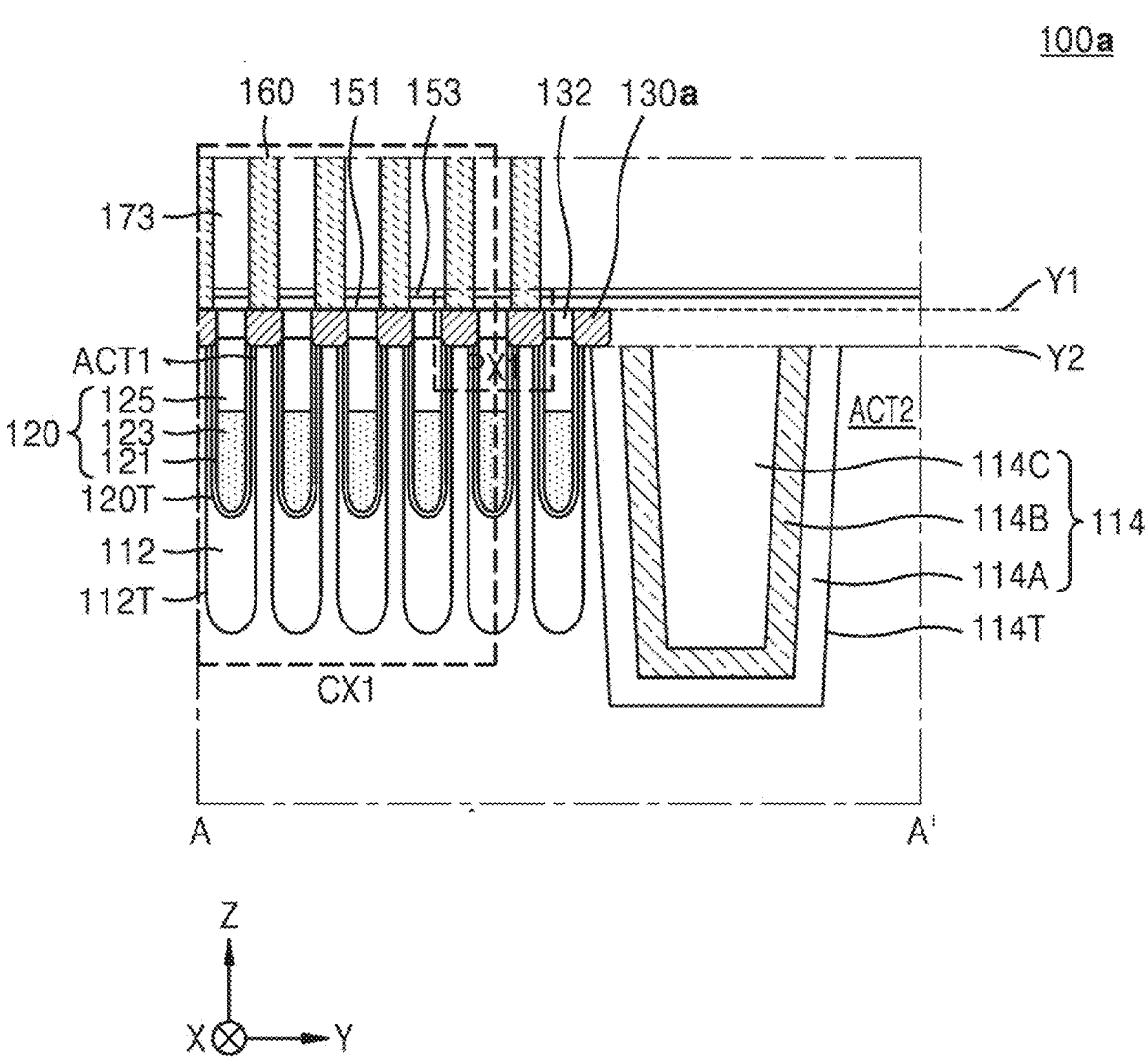
FIG. 4A is a cross-sectional view taken along a line A-A' of FIG. 2 of a semiconductor device according to another example embodiment of the inventive concepts.
Figure 4B:
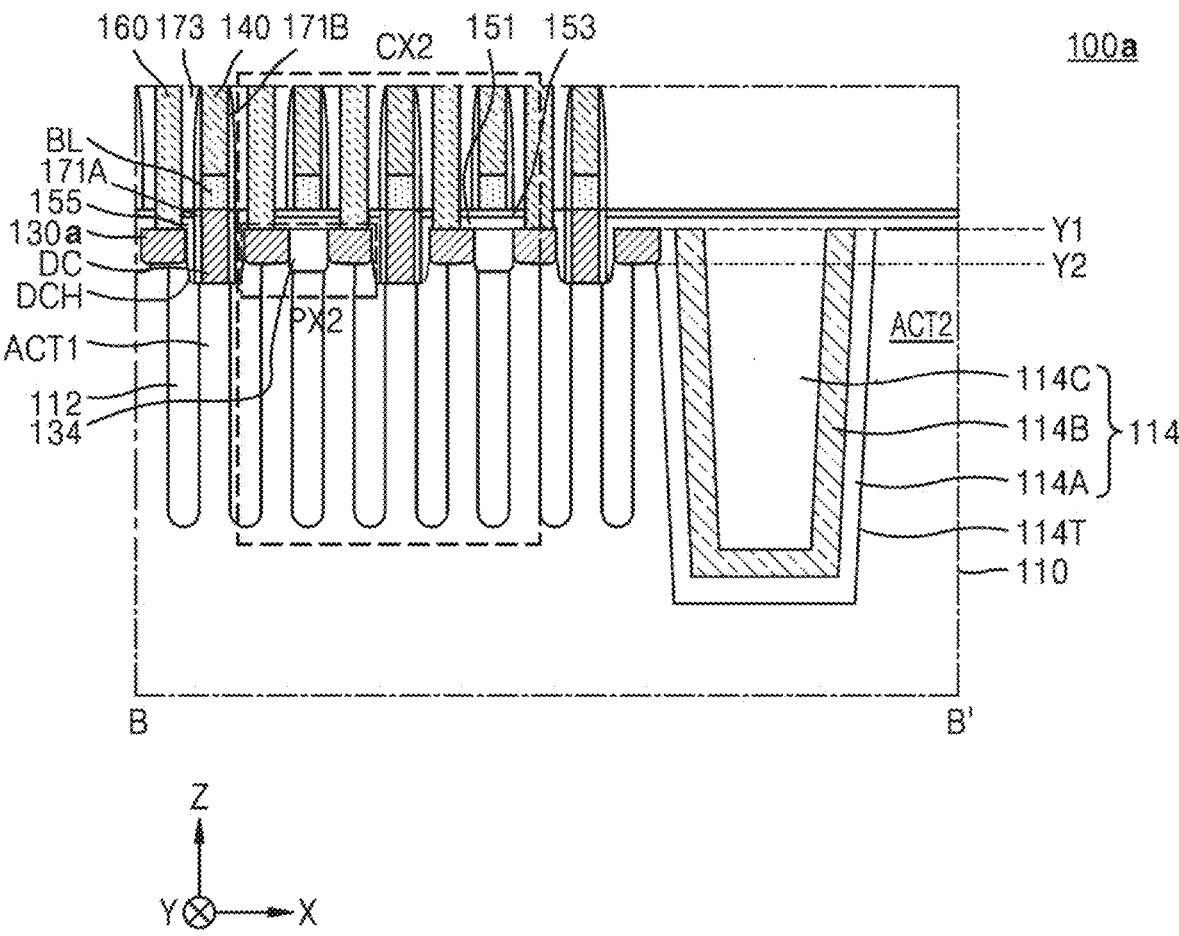
FIG. 4B is a cross-sectional view taken along a line B-B' of FIG. 2 of a semiconductor device according to another example embodiment of the inventive concepts.

FIG. 4A is a cross-sectional view taken along a line A-A' of FIG. 2 of a semiconductor device 100a according to another example embodiment of the inventive concepts. FIG. 4B is a cross-sectional view taken along the line B-B' of FIG. 2 of the semiconductor device 100a according to another example embodiment of the inventive concepts. Since each configuration of the semiconductor device 100a shown in FIGS. 4A and 4B is similar to the corresponding configuration of the semiconductor device 100 shown in FIGS. 1 to 3B, the differences therebetween will be mainly described below.

Referring to FIGS. 4A and 4B, as shown in the illustrated line Y1, the upper surface of a cell pad structure 130a is disposed at the same or substantially similar vertical level as the upper surface of a second active region ACT2, or as shown in the illustrated line Y2, the lower surface of the cell pad structure 130a is disposed at the same or substantially similar vertical level as the lower surface of the second active region ACT2. This may be accomplished by performing a process of recessing the upper surface of the first active region ACT1 of the substrate 110 as described later with reference to FIGS. 6C and 6D. Compared with the manufacturing process of the semiconductor device 100 described with reference to FIGS. 1 to 3B, in the manufacturing process of the semiconductor device 100a illustrated in FIGS. 4A and 4B, a recess process, which will be described later with reference to FIG. 6D, may be performed until the height of the first active region ACT1 becomes lower than before.

In some example embodiments, the lower surfaces of the plurality of cell pad structures 130a may be disposed at a lower vertical level than the lower surfaces of the first pad separation pattern 132, and the upper surfaces of the plurality of cell pad structures 130a may be disposed at the same vertical level as the upper surfaces of the first pad separation pattern 132.

In some example embodiments, the lower surfaces of the plurality of cell pad structures 130a may be disposed at a higher vertical level than the lower surfaces of the second pad separation pattern 134, and the upper surface of the plurality of cell pad structures 130a may be disposed at the same vertical level as the upper surface of the second pad separation pattern 134.

Figure 5A:
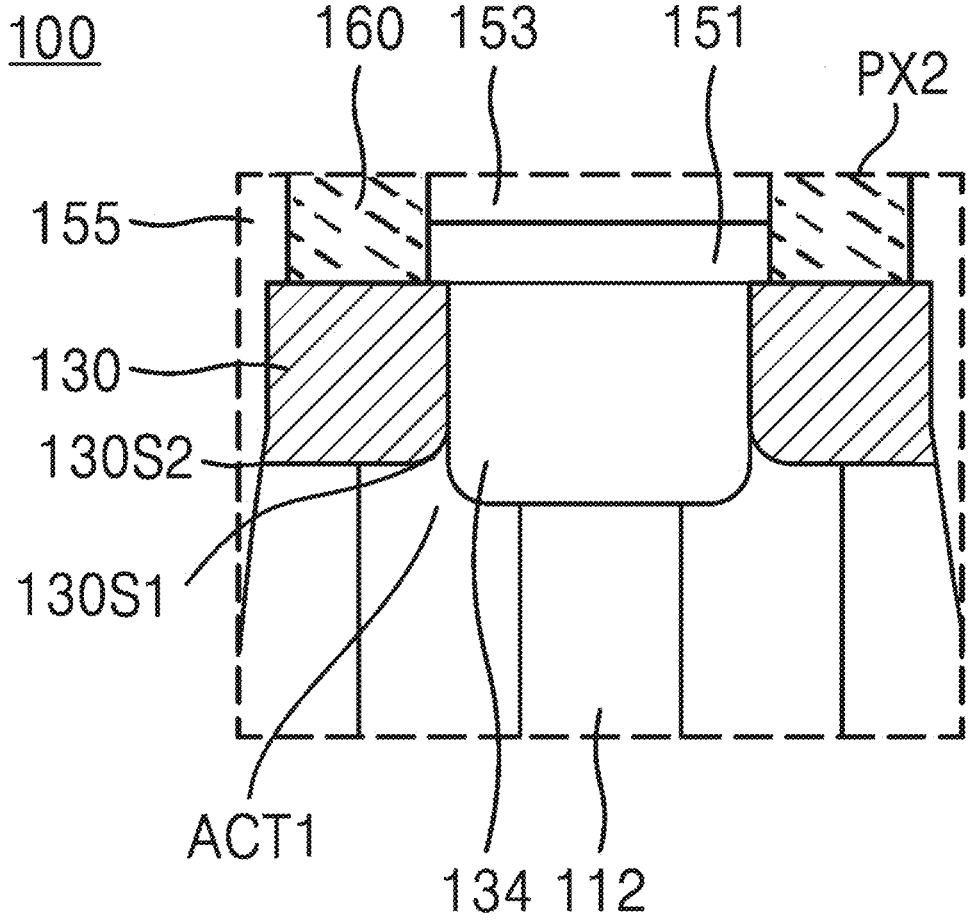
FIG. 5A is an enlarged cross-sectional view of a portion PX2 of FIG. 3B.
Figure 5B:
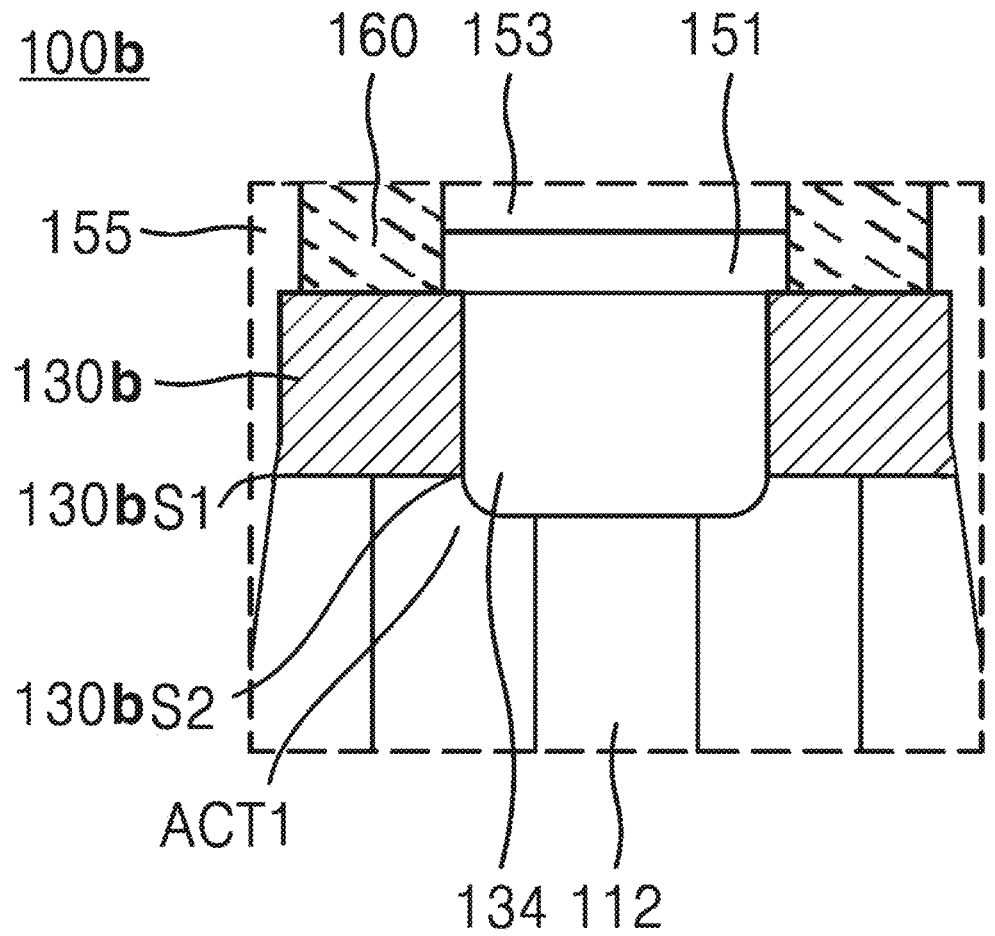
FIG. 5B is an enlarged cross-sectional view of a portion corresponding to a portion PX2 of FIG. 3B of a semiconductor device according to another example embodiment of the inventive concepts.

FIG. 5A is an enlarged cross-sectional view of a portion PX2 of FIG. 3B. FIG. 5B is an enlarged cross-sectional view of a portion corresponding to the portion PX2 of FIG. 3B of a semiconductor device 100b according to another example embodiment of the inventive concepts.

Referring to FIG. 5A, in the semiconductor device 100 shown in FIGS. 1 to 3B, in relation to a cross-section of the cell pad structure 130 perpendicular to the second direction (Y direction), a corner 130S1 adjacent to the second pad separation pattern 134 among both corners of the lower surface of the cross-section may be rounded, and the remaining corner 130S2 among both corners of the lower surface of the cross-section may have an angled. Thus, the cross-section of the cell pad structure 130 may have a quadrangular shape including a rounded corner. This shape is because a deposition process of forming the cell pad structure 130, which will be described later with reference to FIG. 6E, is performed after the first patterning process of forming the second pad separation pattern 134, which will be described later with reference to FIG. 6B, is first performed.

On the other hand, referring to FIG. 5B, in the semiconductor device 100b, a cross-section of a cell pad structure 130b perpendicular to the second direction (Y direction) may have a quadrangular shape in which both corners 130bS1 and 130bS2 of the lower surface of the cross-section are angled. Thus, the cross-section of the cell pad structure 130 may have a quadrangular shape with angled corners. This shape is because the first patterning process of forming the second pad separation pattern 134 to be described later with reference to FIG. 6B is performed after the deposition process of forming the cell pad structure 130 to be described later with reference to FIG. 6E is first performed.

FIGS. 6A to 6H are cross-sectional views illustrating a method of manufacturing the semiconductor device 100, according to an example embodiment of the inventive concepts. For example, FIGS. 6A to 6H are enlarged cross-sectional views illustrating portions CX1 and CX2 of FIGS. 3A and 3B.

Figure 6A:
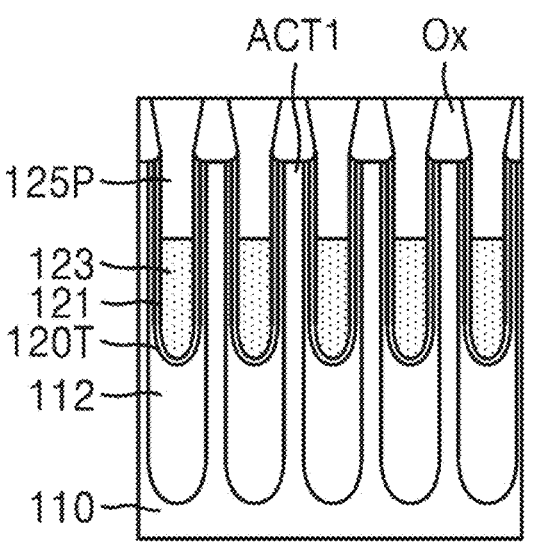
FIGS. 6A to 6H are cross-sectional views illustrating a method of manufacturing a semiconductor device, according to an example embodiment of the inventive concepts.
Figure 6A:
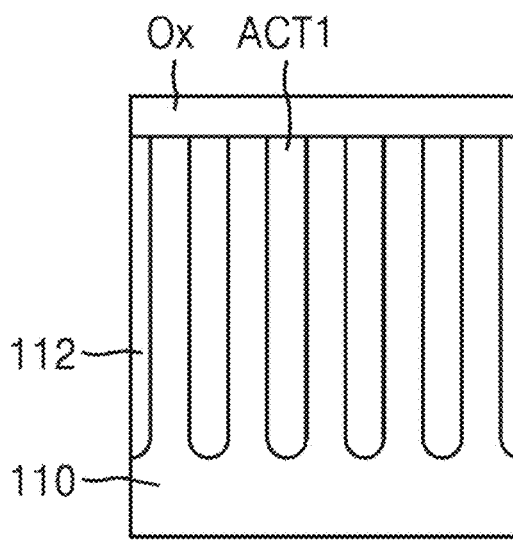
Figure 6B:
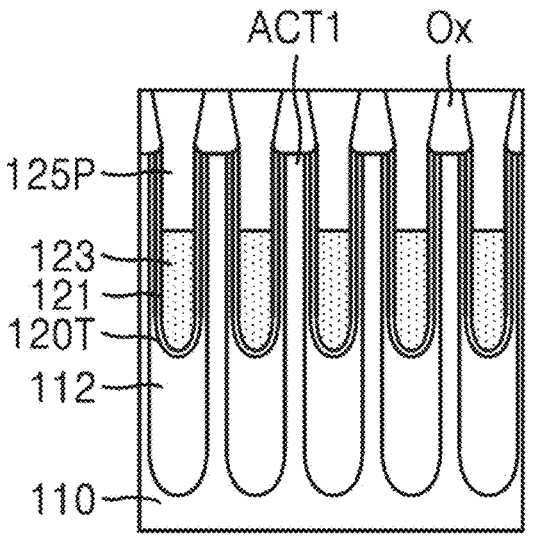
Figure 6B:
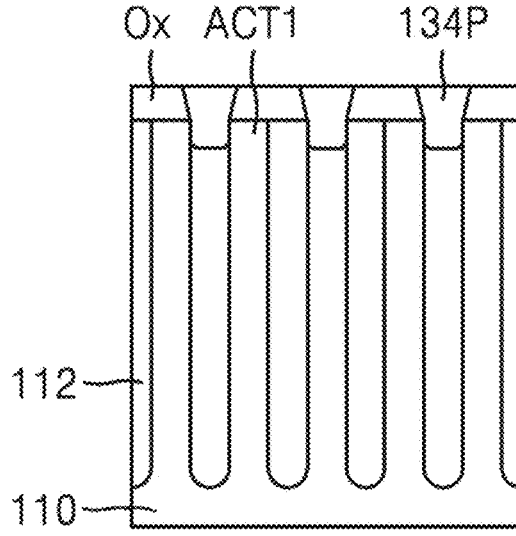

Referring to FIG. 6A, a plurality of word line trenches 120T may be formed in the substrate 110, and a gate dielectric film 121, a gate electrode 123, and a capping insulating film 125P may be sequentially formed in the plurality of word line trenches 120T. After that, the first mask pattern Ox used to form the gate dielectric film 121, the gate electrode 123, and the capping insulating film 125P remains, and a planarization process may be performed so that the upper surface of the capping insulating film 125P is disposed at the same vertical level as the upper surface of the first mask pattern Ox. At this time, an upper portion of the capping insulating film 125P may be the first pad separation pattern 132 (see FIG. 6D) through processes to be described later with reference to FIGS. 6B to 6D, and a lower portion of the capping insulating film 125P may be the capping insulating film 125 included in the buried gate structure 120 (refer to FIG. 6D). The planarization process may be, for example, a chemical mechanical polishing (CMP) process, but is not limited thereto. Because the remaining first mask pattern Ox is used instead of using a separate mask pattern, the semiconductor device manufacturing process may be simplified and the manufacturing process cost may be reduced. In addition, because the first pad separation pattern 132 (refer to FIG. 6D) may be formed in a self-aligning manner, misalignment of the cell pad structure 130 (refer to FIG. 6F) may be mitigated or prevented, and reliability of the semiconductor device may be improved.

Referring to FIG. 6B, a first patterning process of forming a second pad separation pattern 134 may be performed. For example, a second mask pattern (not shown) having an opening (not shown) is formed on the first mask pattern Ox, and a first patterning process of etching the first mask pattern Ox, the substrate 110, and the element isolation film 112 may be performed using the second mask pattern (not shown) as an etching mask. Thereafter, a second pad separation pattern 134P may be formed by depositing silicon nitride and performing a planarization process. The planarization process may be, for example, a CMP process.

Figure 6C:
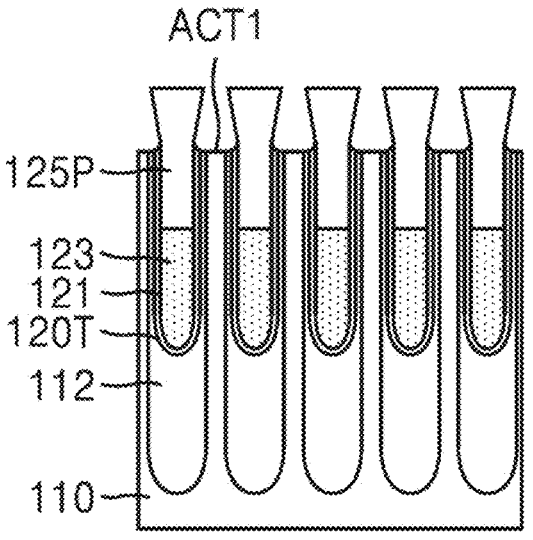
Figure 6C:
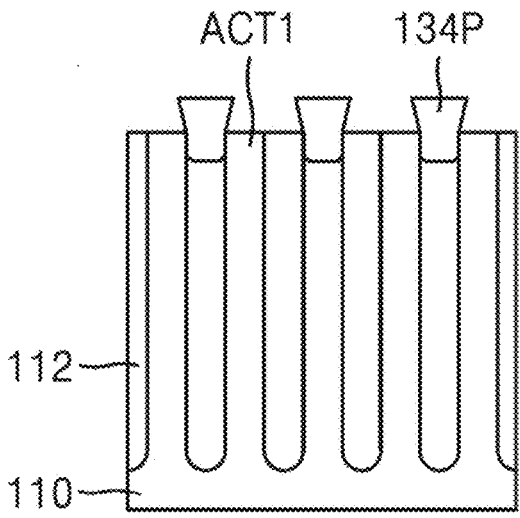

Referring to FIG. 6C, the first mask pattern Ox may be recessed. The first mask pattern Ox may be recessed to expose the first active region ACT1 and the element isolation film 112 of the substrate 110.

Figure 6D:
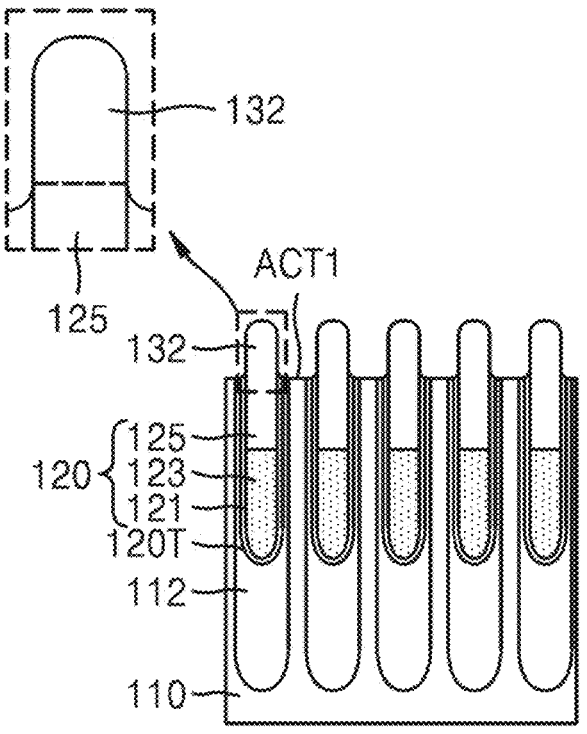
Figure 6D:
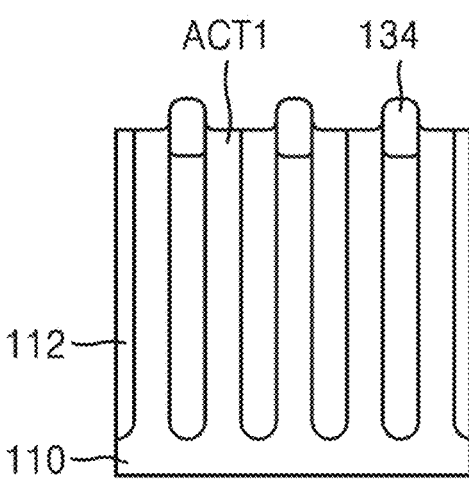
Figure 6E:
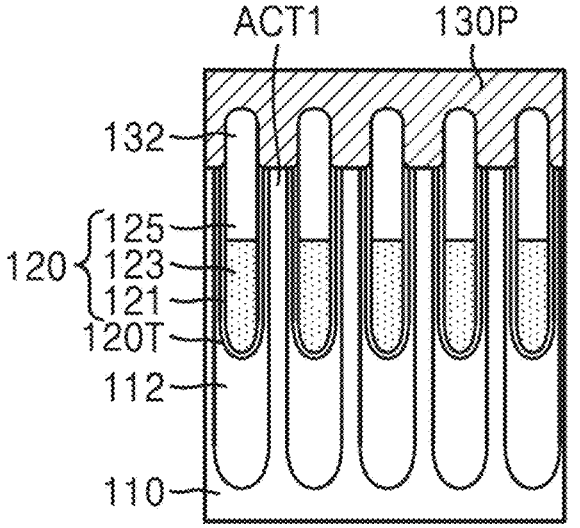
Figure 6E:
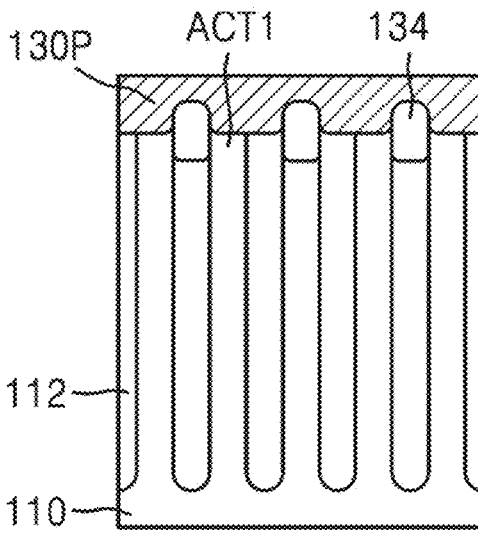

Referring to FIG. 6D, upper surfaces of the substrate 110 and the element isolation film 112 may be recessed. Accordingly, an upper portion of the second pad separation pattern 134P (refer to FIG. 6C) may also be partially recessed, thereby forming the second pad separation pattern 134. At this time, a region where the substrate 110 and the element isolation film 112 and the first pad separation pattern 132 meet may be recessed in a rounded shape, and a region where the substrate 110 and the element isolation film 112 and the second pad separation pattern 134 meet may also be recessed in a rounded shape. Through the recess process, the upper surface of the first active region ACT1 is located at a lower vertical level than the upper surface of the second active region ACT2, so that even when the cell pad structure 130 (refer to FIG. 6F) is disposed on the upper surface of the first active region ACT1, a step difference between the cell array region MCA and the peripheral circuit region PCA due to the length in the third direction (Z direction) of the cell pad structure 130 (refer to FIG. 6F) may be reduced or minimized. In addition, compared to the case where the recess process is not performed, the desired length in third direction (Z direction) of the first mask pattern Ox used to form the first pad separation pattern 132 may be reduced, thereby reducing the difficulty of the manufacturing process of the semiconductor device 100.

Referring to FIG. 6E, a cell pad structure pattern 130P may be formed. In some example embodiments, the cell pad structure pattern 130P may include Si, Ge, W, WN, Co, Ni, Al, Mo, Ru, Ti, TiN, Ta, TaN, Cu, or a combination thereof. For example, the cell pad structure pattern 130P may include polysilicon.

Figure 6F:
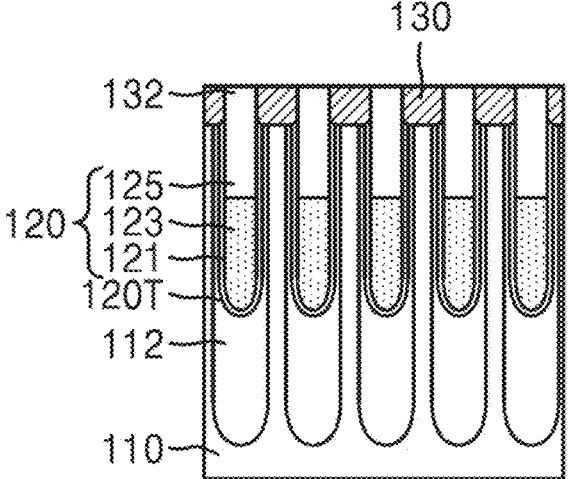
Figure 6F:
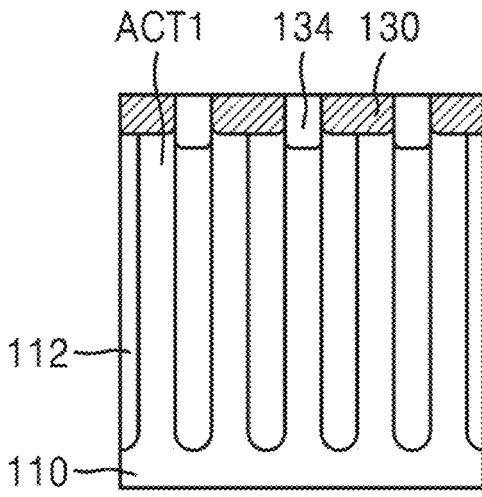

Referring to FIG. 6F, a planarization process may be performed to form the cell pad structure 130. The planarization process may be, for example, a CMP process.

Figure 6G:
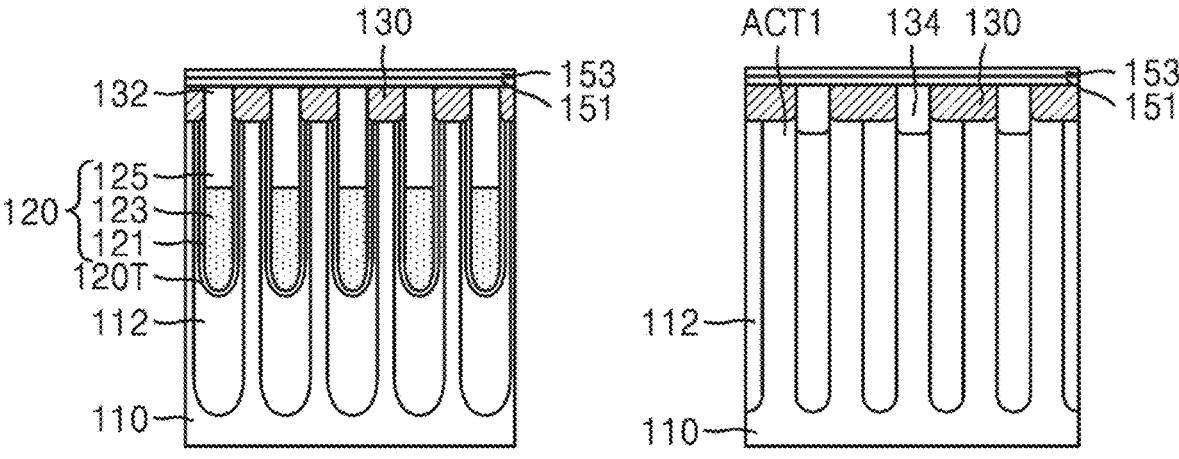

Referring to FIG. 6G, the first insulating layer 151 and the second insulating layer 153 may be sequentially formed on the cell pad structure 130, the first pad separation pattern 132, and the second pad separation pattern 134. The first insulating layer 151 and the second insulating layer 153 may be formed by, for example, a deposition process.

Figure 6H:
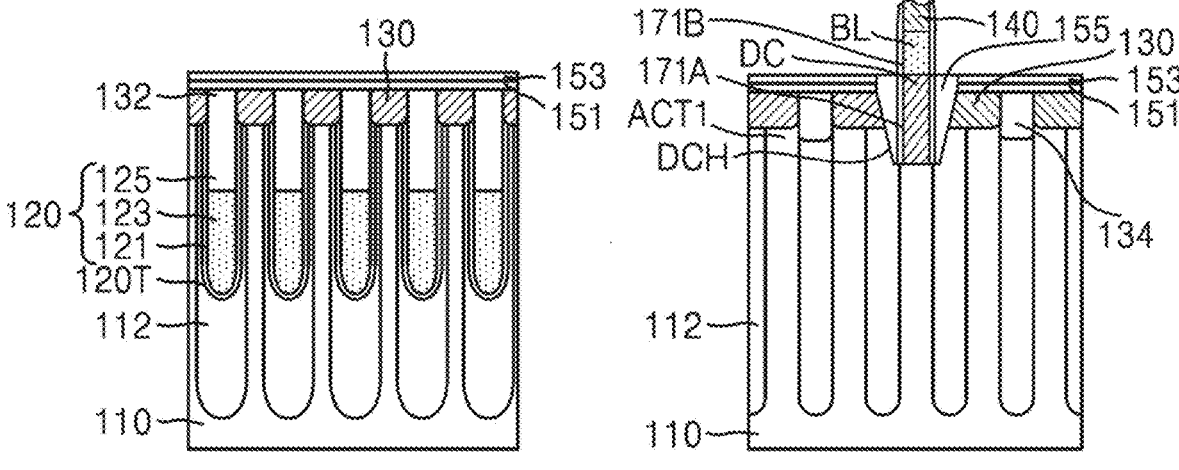

Referring to FIG. 6H, a direct contact DC, a bit line BL, and an insulating capping structure 140 may be sequentially formed on the substrate 110. First, a direct contact hole DCH passing through a part of the substrate 110, a part of the element isolation film 112, the cell pad structure 130, the first insulating layer 151, and the second insulating layer 153 may be formed, and a direct contact DC, a bit line BL, and an insulating capping structure 140 may be sequentially formed on the direct contact hole DCH. Thereafter, a mask pattern (not shown) may be formed on the insulating capping structure 140, and the direct contact DC, the bit line BL, and the insulating capping structure 140 may be patterned using the mask pattern. Thereafter, a direct contact spacer 171A and a bit line spacer 171B may be formed, and a first insulating pattern 155 filling the direct contact hole DCH may be formed. In this case, the first insulating pattern 155 may be formed to have the same height as the upper surface of the second insulating layer 153. After the process described with reference to FIG. 6G is performed, the cross-section of the cell pad structure 130 perpendicular to the second direction (Y direction) may have the shape of the cross-section described with reference to FIG. 5A.

In another example embodiment of the inventive concepts, the first patterning process described with reference to FIG. 6B may be performed after the planarization process described with reference to FIG. 6F. For example, after the process of forming the buried gate structure 120 and the planarization process described with reference to FIG. 6A are performed, the recess process described with reference to FIGS. 6C and 6D is performed, and thereafter, the process of forming the cell pad structure 130 described with reference to FIGS. 6E and 6F may be performed, and then the first patterning process described with reference to FIG. 6B may be performed. In this case, in the recess process described with reference to FIGS. 6C and 6D, a region where the substrate 110 and the element isolation film 112 and the first pad separation pattern 132 meet may be recessed in a rounded shape, but a region where the substrate 110 and the element isolation film 112 and the second pad separation pattern 134 meet may be recessed in an angled shape. Accordingly, after the formation processes of the direct contact DC, the bit line BL, and the insulating capping structure 140 described with reference to FIG. 6H, a cross-section of the cell pad structure 130 perpendicular to the second direction (Y-direction) may have the shape of the cross-section described with reference to FIG. 5B.

While the inventive concepts have been particularly shown and described with reference to some example embodiments thereof, it will be understood that various changes in form and details may be made therein without departing from the spirit and scope of the following claims.

What is claimed is:

1. A semiconductor device comprising:
   a substrate including a cell array region and a peripheral circuit region, the substrate including a plurality of first active regions defined in the cell array region and at least one second active region defined in the peripheral circuit region;
   a plurality of word lines in the substrate and extending in a first direction;
   a plurality of bit lines in the cell array region of the substrate and extending in a second direction perpendicular to the first direction;

a plurality of first pad separation patterns on corresponding ones of the word lines, respectively, the first pad separation patterns extending in the first direction;

a cell pad structure on the substrate and between two adjacent ones of the first pad separation patterns; and a second pad separation pattern between two adjacent ones of the first pad separation patterns and being adjacent to the cell pad structure, wherein a cross-section of the cell pad structure perpendicular to the first direction has a quadrangular shape, in which both corners of a lower surface of the cross-section are rounded, and upper surfaces of the plurality of first pad separation patterns, the cell pad structure, and the second pad separation pattern are on a same plane.

2. The semiconductor device of claim 1, wherein a cross-section of the cell pad structure perpendicular to the second direction includes a first corner and a second corner at a lower surface thereof, the first corner adjacent to the second pad separation pattern and having a rounded shape, the second corner having a square shape.

3. The semiconductor device of claim 1, wherein a cross-section of the cell pad structure perpendicular to the second direction has a quadrangular shape, in which two opposite corners of a lower surface of the cross-section are angled.

4. The semiconductor device of claim 1, wherein an upper surface of each of the first active regions is at a lower vertical level than an upper surface of the second active region.

5. The semiconductor device of claim 1, wherein an upper surface of the cell pad structure is at a higher vertical level than an upper surface of the second active region, and a lower surface of the cell pad structure is at a lower vertical level than the upper surface of the second active region.

6. The semiconductor device of claim 1, wherein an upper surface of the cell pad structure is at a same vertical level as an upper surface of the second active region, and a lower surface of the cell pad structure is at a lower vertical level than the upper surface of the second active region.

7. The semiconductor device of claim 1, further comprising:

a capping insulating film between a corresponding one of the word lines and a corresponding one of the first pad separation patterns, wherein a length in the second direction of the corresponding one of the first pad separation patterns is same as a length in the second direction of the capping insulating film.

8. The semiconductor device of claim 7, wherein the capping insulating film and the corresponding one of the first pad separation patterns are portions of a single integral structure, respectively.

9. The semiconductor device of claim 1, wherein an upper surface of the cell pad structure is at a same vertical level as an upper surface of the second pad separation pattern, and the lower surface of the cell pad structure is at a higher vertical level than a lower surface of the second pad separation pattern.

10. A semiconductor device comprising:

a substrate including a cell array region, a boundary region, and a peripheral circuit region, the substrate including a plurality of first active regions defined in the cell array region and at least one second active region defined in the peripheral circuit region;

a word line in the substrate and extending in a first direction;

a bit line in the cell array region of the substrate and extending in a second direction perpendicular to the first direction;

a plurality of first pad separation patterns on the word line, the first pad separation patterns extending in the first direction;

a cell pad structure on the substrate and between two adjacent ones of the first pad separation patterns;

a second pad separation pattern between two adjacent ones of the first pad separation patterns, and the second pad separation pattern being adjacent to the cell pad structure;

a first insulating layer on the cell pad structure and extending to the boundary region; and a second insulating layer on the first insulating layer and extending to the boundary region, wherein a first cross-section of the cell pad structure perpendicular to the first direction has a quadrangular shape, in which both corners of a lower surface are rounded, and wherein an upper surface of the first insulating layer and an upper surface of the second insulating layer are flat, and upper surfaces of the plurality of first pad separation patterns, the cell pad structure, and the second pad separation pattern are on a same plane.

11. The semiconductor device of claim 10, wherein a second cross-section of the cell pad structure perpendicular to the second direction includes a first corner and a second corner at a lower surface thereof, the first corner being adjacent to the second pad separation pattern and having rounded corner, the second corner having a square shape.

12. The semiconductor device of claim 10, wherein a second cross-section of the cell pad structure perpendicular to the second direction has a quadrangular shape, in which both corners of a lower surface are angled.

13. The semiconductor device of claim 10, wherein an upper surface of the cell pad structure is at a higher vertical level than an upper surface of the second active region, and a lower surface of the cell pad structure is at a lower vertical level than the upper surface of the second active region.

14. The semiconductor device of claim 10, wherein an upper surface of the cell pad structure is at same vertical level as an upper surface of the second active region, and a lower surface of the cell pad structure is at a lower vertical level than the upper surface of the second active region.

15. The semiconductor device of claim 10, further comprising:

a capping insulating film in a word line trench extending into the substrate, the capping insulating film being between the word line and a corresponding one of the first pad separation patterns, wherein the corresponding one of the first pad separation patterns is aligned with the capping insulating film in a third direction, the third direction being perpendicular to both the first direction and the second direction.

16. The semiconductor device of claim 15, wherein the capping insulating film and the corresponding one of the first pad separation patterns are portions of a single integral structure, respectively.

17. A semiconductor device comprising:

a substrate including a cell array region, a boundary region, and a peripheral circuit region, the substrate including a plurality of first active regions defined in the cell array region and at least one second active region defined in the peripheral circuit region;

a word line in the substrate and extending in a first direction;

a capping insulating film on the word line;

a bit line in the cell array region of the substrate and extending in a second direction perpendicular to the first direction;

a direct contact between the bit line and a corresponding one of the first active regions;

a plurality of cell pad structures in contact with the first active regions, respectively, the cell pad structures being on the substrate;

a buried contact on a corresponding one of the cell pad structures;

a first pad separation pattern on the word line and extending in the first direction;

a second pad separation pattern between two adjacent ones of the cell pad structures and extending in the second direction;

a buffer layer on the cell pad structures and extending to the boundary region; and a first insulating layer on the buffer layer and extending to the boundary region, wherein a first cross-section of each of the cell pad structures perpendicular to the first direction has a quadrangular shape, in which both corners of a lower surface are rounded, wherein an upper surface of the buffer layer and an upper surface of the first insulating layer are flat, wherein the capping insulating film and the first pad separation pattern are portions of a single integral structure, respectively, and wherein upper surfaces of the first pad separation pattern, the cell pad structures, and the second pad separation pattern are on a same plane.

18. The semiconductor device of claim 17, wherein a second cross-section of each of the cell pad structures perpendicular to the second direction includes a first corner and a second corner at a lower surface thereof, the first corner being adjacent to the second pad separation pattern and having a rounded corner, the second corner having a square shape.

19. The semiconductor device of claim 17, wherein a second cross-section of each of the cell pad structures perpendicular to the second direction has a quadrangular shape, in which both corners of a lower surface of the cross-section are angled.

20. The semiconductor device of claim 17, wherein an upper surface of each of the cell pad structures is at a higher vertical level than an upper surface of the second active region, and a lower surface of each of the cell pad structures is at a lower vertical level than the upper surface of the second active region.

\* \* \* \* \*